United States Patent [19]

Horie et al.

[11] Patent Number: 5,566,198
[45] Date of Patent: Oct. 15, 1996

[54] METHOD OF FORMING A GROOVE IN A SEMICONDUCTOR LASER DIODE AND A SEMICONDUCTOR LASER DIODE

[75] Inventors: Hideyoshi Horie; Toshinari Fujimori; Satoru Nagao; Nobuyuki Hosoi; Hideki Goto, all of Ushiku, Japan

[73] Assignee: Mitsubishi Chemical Corporation, Tokyo, Japan

[21] Appl. No.: 380,836

[22] Filed: Jan. 30, 1995

[30] Foreign Application Priority Data

Jan. 31, 1994 [JP] Japan .................... 6-027368
Jan. 31, 1994 [JP] Japan .................... 6-027370

[51] Int. Cl.$^6$ .................................... H01S 3/18
[52] U.S. Cl. .............................. 372/46; 372/45
[58] Field of Search ................ 372/46, 43, 45

[56] References Cited

U.S. PATENT DOCUMENTS

| | | | |
|---|---|---|---|
| 4,613,387 | 9/1986 | Turley | 372/46 |
| 5,163,064 | 11/1992 | Kim et al. | 372/46 |
| 5,390,205 | 2/1995 | Mori et al. | 372/46 |

FOREIGN PATENT DOCUMENTS

0544439A1  6/1993  European Pat. Off. .
3324594A1  1/1994  Germany .

OTHER PUBLICATIONS

*Patent Abstracts of Japan*, vol. 16, No. 308 (1992). JP4085503.
*Patent Abstracts of Japan*, vol. 8, No. 13 (1984). JP 8175886.

Primary Examiner—Rodney B. Bovernick
Assistant Examiner—Robert McNutt
Attorney, Agent, or Firm—David G. Conlin; Peter F. Corless

[57] ABSTRACT

The disclosure describes a method of forming a groove in a structure of a semiconductor laser diode, which comprises a crystal growth procedure of epitaxial growth of a core layer comprising MP, wherein M represents one or more of elements belonging to group IIIb of periodic table and an upper layer comprising MAs, wherein M represents one or more of elements belonging to group IIIb of periodic table, successively on (100) surface of MAs crystals in a lower layer comprising MAs; a photolithography and wet etching procedure of, after forming an etching mask on the upper layer, forming an etching window to the etching mask; a first etching procedure of selective etching the upper layer; and a second etching procedure of selective etching other faces except for the face in which (111) face of MP crystals in the core layer is exposed.

10 Claims, 6 Drawing Sheets

METHOD OF FORMING A GROOVE IN A SEMICONDUCTOR LASER DIODE AND A SEMICONDUCTOR LASER DIODE

BACKGROUND OF THE INVENTION

The present invention relates to a method of forming a groove in a semiconductor laser diode and a semiconductor laser diode having the groove. More in particular, the present invention relates to a method of forming a groove, which can form a groove of a definite shape easily and at a good reproducibility, as well as a novel semiconductor laser diode having such a groove formed by etching to eliminate a portion of a current blocking layer grown over an active layer, which is improved such that the shape of the groove formed in the current blocking layer can be defined easily and at a good reproducibility. The method of forming the groove according to the present invention also includes a method of forming a ridge in the meaning that the ridge is formed between the grooves.

A number of semiconductor laser diodes having a groove in the semiconductor laser diode have been proposed so far. Specifically, there can be mentioned, for example, a semiconductor laser diode having a groove formed by etching to eliminate a portion of a current blocking layer grown over an active layer, and a semiconductor laser diode having a ridge formed by etching to eliminate a portion of an upper clad layer grown over an active layer, the ridge being formed configurationally between grooves. Accordingly, the method of forming the groove is important in the fabrication of the semiconductor laser diodes.

In a semiconductor laser diode having a groove formed by etching to eliminate a portion of a current blocking layer grown over an active layer, since current blocking is conducted by the remainder, it is important to prevent large side etching caused by the wet etching process upon fabrication of the laser diode and to form a groove of a definite shape, particularly, a groove having a constant bottom width at a good reproducibility. That is, if the bottom width of the groove changes greatly by the side etching caused by the wet etching process upon fabrication of the laser diode, a threshold current fluctuates, for example, near field pattern of a laser diode has no reproducibility, and discrete chips obtained from the same wafer have distribution of characteristics.

It has been desired to provide a method of forming a groove capable of forming a groove of a definite shape easily and at a good reproducibility, and further, a method of forming a groove while preventing large side etching.

It has, further, been desired to provide a novel semiconductor laser diode improved such that the shape of a groove formed on a current blocking layer can be fined easily and at a good reproducibility.

As a result of the present inventions' earnest studies for satisfying the foregoing demands, it has been found that: by using a structure of sandwiching a layer comprising MP (wherein M represents one or more of elements belonging to the group IIIb of the periodic table) with layers comprising MAs (wherein M represents one or more of elements belonging to the group IIIb of the periodic table), when a selective etching of the MP layer using the upper MAs layer as an etching mask layer and the lower MAs layer as an etching stop layer is performed, the side etching is restricted, and then, on the basis of the above-mentioned findings, it has been further found that:

by epitaxial growth of a core layer comprising MP (wherein M represents one or more of elements belonging to the group IIIb of the periodic table) and an upper layer comprising MAs (wherein M represents one or more of elements belonging to the group IIIb of the periodic table) successively on (100) surface of MAs crystals in the lower layer comprising MAs, after depositing an etching mask on the upper layer, forming an etching window to the etching mask, and performing a selective etching of the upper layer and other faces except for the face in which (111) face of the MP crystal in the core layer is exposed, a groove of a definite shape can be formed easily and at a good reproducibility, the bottom width of the groove can be controlled easily while restricted side etching, and since a semiconductor laser diode having such a groove can be obtained in the same wafer uniformly, laser diodes obtained from the same wafer showing little dispersion of the horizontal near field pattern and threshold value can be produced at a good reproducibility.

The present invention has been accomplished based on the above-mentioned findings.

SUMMARY OF THE INVENTION

An object of the present invention is to provide a method of forming a groove, which can form a groove of a definite shape easily and at a good reproducibility, while preventing large side etching.

Another object of the present invention is to provide a novel semiconductor laser diode improved such that the shape of a groove formed to a current blocking layer can be defined easily and at a good reproducibility.

To achieve the aim, in a first aspect of the present invention, there is provided a method of forming a groove in a structure of a semiconductor laser diode, which comprises a crystal growth procedure of epitaxial growth of a core layer comprising MP (wherein M represents one or more of elements belonging to group IIIb of periodic table) and an upper layer comprising MAs (wherein M represents one or more of elements belonging to group IIIb of periodic table) successively on (100) surface of MAs crystals in a lower layer comprising MAs; a photolithography and wet etching procedure of, after forming an etching mask on the upper layer, forming an etching window to the etching mask; a first etching procedure of selective etching the upper layer; and a second etching procedure of selective etching other faces except for the face in which (111) face of MP crystals in the core layer is exposed.

In a second aspect of the present invention, there is provided a semiconductor laser diode comprising at least a first conduction-type lower clad layer, an active layer, a second conduction-type first upper clad layer, an etching stop layer, a first conduction-type or undoped type current blocking layer, a cap layer, a second conduction-type second upper clad layer, and a second conduction-type contact layer which are successively grown on a first conduction-type substrate, and having a groove formed by etching to eliminate a portion of the current blocking layer and the cap layer grown over the active layer, each of the etching stop layer and the cap layer comprising MAs, wherein M represents one or more of elements belonging to the group IIIb of the periodic table; the current blocking layer comprising MP, wherein M represents one or more of elements belonging to the group IIIb of the periodic table; and (111) face of MP crystals in the current blocking layer being exposed on wall surface of the groove formed in the current blocking layer.

In a third aspect of the present invention, there is provided a semiconductor laser diode comprising at least a first conduction-type lower clad layer, an active layer, a second conduction-type first upper clad layer, an etching stop layer, a first conduction-type or undoped type current blocking layer, a second conduction-type second upper clad layer, and a second conduction-type contact layer which are successively grown on a first conduction-type substrate, and having a groove formed by etching to eliminate a portion of the current blocking layer grown over the active layer, the etching stop layer comprising MAs, wherein M represents one or more of elements belonging to the group IIIb of the periodic table; the current blocking layer comprising MP, wherein M represents one or more of elements belonging to the group IIIb of the periodic table; and (111) face of MP crystals in the current blocking layer being exposed on wall surface of the groove formed in the current blocking layer.

In a fourth aspect of the present invention, there is provided a semiconductor laser diode comprising at least a first conduction-type lower clad layer, an active layer, a second conduction-type first upper clad layer, an etching stop layer, a first conduction-type or undoped type current blocking layer, a cap layer, a second conduction-type second upper clad layer, and a second conduction-type contact layer which are successively grown on a first conduction-type substrate, and having a groove formed by etching to eliminate a portion of the current blocking layer grown over the active layer, the etching stop layer at the bottom of the groove formed in the current blocking layer being eliminated by wet etching; each of the etching stop layer and the cap layer comprising MAs, wherein M represents one or more of elements belonging to the group IIIb of the periodic table; the current blocking layer comprising MP, wherein M represents one or more of elements belonging to the group IIIb of the periodic table; and (111) face of MP crystals in the current blocking layer being exposed on wall surface of the groove formed in the current blocking layer.

In a fifth aspect of the present invention, there is provided a semiconductor laser diode comprising at least a first conduction-type lower clad layer, an active layer, a second conduction-type first upper clad layer, an etching stop layer, a first conduction-type or undoped type current blocking layer, a second conduction-type second upper clad layer, and a second conduction-type contact layer which are successively grown on a first conduction-type substrate, and having a groove formed by wet etching to eliminate a portion of the current blocking layer grown over the active layer, the etching stop layer at the bottom of the groove formed in the current blocking layer being eliminated by wet etching; the etching stop layer comprising MAs, wherein M represents one or more of elements belonging to the group IIIb of the periodic table; the current blocking layer comprising MP, wherein M represents one or more of elements belonging to the group IIIb of the periodic table; and face of MP crystals in the current blocking layer being exposed on wall surface of the groove formed in the current blocking layer.

In a sixth aspect of the present invention, there is provided a semiconductor laser diode comprising at least a first conduction-type lower clad layer, an active layer, a second conduction-type first upper clad layer, an etching stop layer, a first conduction-type or undoped type current blocking layer, a cap layer, a second conduction-type second upper clad layer, and a second conduction-type contact layer which are successively grown on a first conduction-type substrate, and having a groove formed by wet etching to eliminate a portion of the current blocking layer grown over the active layer, each of the etching stop layer and the cap layer comprising MAs, wherein M represents one or more of elements belonging to the group IIIb of the periodic table; the current blocking layer comprising MP, wherein M represents one or more of elements belonging to the group IIIb of the periodic table; (111) face of MP crystals in the current blocking layer being exposed on wall surface of the groove formed in the current blocking layer; and the groove being formed by a photolithography and wet etching procedure of, after fabricating an etching mask on the cap layer, forming an etching window to the etching mask, a first etching procedure of selective wet etching the cap layer, and a second etching procedure of selective wet etching other faces except for the face in which (111) face of MP crystals in the current blocking layer is exposed.

In a seventh aspect of the present invention, there is provided a semiconductor laser diode comprising at least a first conduction-type lower clad layer, an active layer, a second conduction-type first upper clad layer, an etching stop layer, a first conduction-type or undoped type current blocking layer, a second conduction-type second upper clad layer, and a second conduction-type contact layer which are successively grown on a first conduction-type substrate, and having a groove formed by wet etching to eliminate a portion of the current blocking layer grown over the active layer, the etching stop layer comprising MAs, wherein M represents one or more of elements belonging to the group IIIb of the periodic table; the current blocking layer comprising MP, wherein M represents one or more of elements belonging to the group IIIb of the periodic table; (111) face of MP crystals in the current blocking layer being exposed on wall surface of the groove formed in the current blocking layer; and the groove being formed by a photolithography and wet etching procedure of, after fabricating an etching mask on the cap layer, forming an etching window to the etching mask, a first etching procedure of selective wet etching the cap layer, a second etching procedure of selective wet etching other faces except for the face in which (111) face of MP crystals in the current blocking layer is exposed, and a third etching procedure of selective wet etching the cap layer.

In an eighth aspect of the present invention, there is provided a semiconductor laser diode comprising at least a first conduction-type lower clad layer, an active layer, a second conduction-type first upper clad layer, an etching stop layer, a first conduction-type or undoped type current blocking layer, a cap layer, a second conduction-type second upper clad layer, and a second conduction-type contact layer which are successively grown on a first conduction-type substrate, and having a groove formed by wet etching to eliminate a portion of the current blocking layer grown over the active layer, the etching stop layer at the bottom of the groove formed in the current blocking layer being eliminated by wet etching; each of the etching stop layer and the cap layer comprising MAs, wherein M represents one or more of elements belonging to the group IIIb of the periodic table; the current blocking layer comprising MP, wherein M represents one or more of elements belonging to the group IIIb of the periodic table; (111) face of MP crystals in the current blocking layer being exposed on wall surface of the groove formed in the current blocking layer; and the groove being formed by a photolithography and wet etching procedure of, after fabricating an etching mask on the cap layer, forming an etching window to the etching mask, a first etching procedure of selective wet etching the cap layer, a second etching procedure of selective wet etching other faces except for the face in which (111) face of MP crystals in the current blocking layer is exposed, and a third etching procedure of selective wet etching the portion where corresponds to the groove bottom of the etching stop layer.

In a ninth aspect of the present invention, there is provided a semiconductor laser diode comprising at least a first conduction-type lower clad layer, an active layer, a second conduction-type first upper clad layer, an etching stop layer, a first conduction-type or undoped type current blocking layer, a second conduction-type second upper clad layer, and a second conduction-type contact layer which are successively grown on a first conduction-type substrate, and having a groove formed by wet etching to eliminate a portion of the current blocking layer grown over the active layer, the etching stop layer at the bottom of the groove formed in the current blocking layer being eliminated by etching; the etching stop layer comprising MAs, wherein M represents one or more of elements belonging to the group IIIb of the periodic table; the current blocking layer comprising MP, wherein M represents one or more of elements belonging to the group IIIb of the periodic table; (111) face of MP crystals in the current blocking layer being exposed on wall surface of the groove formed in the current blocking layer; and the groove being formed by a photolithography and wet etching procedure of, after fabricating an etching mask on the cap layer, forming an etching window to the etching mask, a first etching procedure of selective wet etching the cap layer, a second etching procedure of selective wet etching other faces except for the face in which (111) face of MP crystals in the current blocking layer is exposed, and a third etching procedure of selective wet etching both of the cap layer and the etching stop layer.

DETAILED DESCRIPTION OF THE INVENTION

Figure 1A:
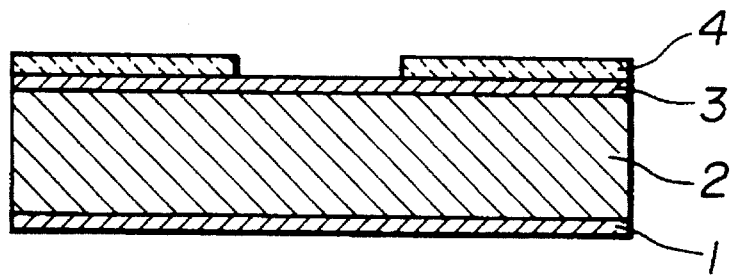
FIG. 1(a), FIG. 1(b) and FIG. 1(c) are explanatory views showing respective steps in a method of forming a groove according to the present invention.
Figure 1B:
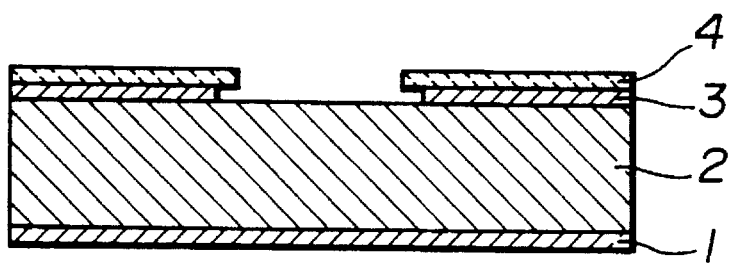
Figure 1C:
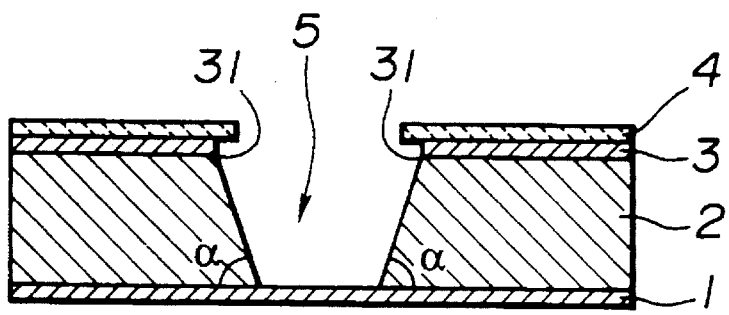

FIG. 1(a) to FIG. 1(c) are explanatory views showing respective steps in a method of forming a groove according to the present invention, in which are shown a lower layer 1, a core layer 2, an upper layer 3 and an etching mask 4. The lower layer 1, the core layer 2 and the upper layer 3 are fabricated successively as epitaxial layers on a single crystal substrate not illustrated.

As the single crystal substrate, a so-called III-V group compound single crystal substrate (wafer) is usually used. In the present invention, a wafer composed of GaAs, GaP or InP is used, for example, taking lattice matching with respect to the material on which will be grown, specifically the into consideration. Among them, GaAs is used preferably.

Each of the lower layer 1 and the upper layer 3 comprises MAs, wherein M represents one or more of elements belonging to the group IIIb of periodic table. As specific constituent materials, there can be used, for example, AlAs, GaAs, InAs, InGaAs and AlGaAs. Among them, GaAs is used preferably. The constituent materials for the lower layer 1 and the upper layer 3 may be identical or different with each other.

The core layer 2 corresponds to various kinds of functional layers, for example, a current blocking layer and a clad layer in a semiconductor laser diode. As a dopant, Si, Se, Te or the like is used usually for n-type, and Be, Zn, C, Mg or the like is used usually for p-type. The thickness is selected from a range of 0.05 to 5 µm for the core layer 2 and from 0.005 to 2 µm for each of the lower layer 1 and the upper layer 3.

At first, in the epitaxial growth procedure, the core layer 2 and the upper layer 3 are epitaxially grown successively on (100) face of the MAs crystal in the lower layer 1. Any of known methods can be used for the epitaxial growth and it is preferable to use a vapor phase epitaxy method, in particular, molecular beam epitaxy (MBE) method or metalorganic chemical vapor deposition (MOCVD) method. In the present invention, since a step is provided to the crystal growth phase in accordance with a known method using an off angle substrate having a surface tilted slightly from the (100) face can also be used as a substrate. In this case, the tilted angle can be selected properly from a range of 0.5 to 15 degree.

Then, in the photolithography and etching procedure, after the etching mask is deposited on the upper layer, the etching window is fabricated to the etching mask. Namely, the etching mask 4 is disposed on the upper layer 3 and a resist stripe, for example, is deposited by photolithography (including, for example, photoresist coating, exposure and development) and then a portion of the etching mask 4 is dry etched, for example, by dry etching technique to form a stripe-like window. FIG. 1(a) shows a state, after etching the etching mask 4, of eliminating the photoresist layer.

The etching mask 4 has a function as a window for protecting the upper layer 3 and for selective etching the upper layer 3 in the next first etching procedure. As the constituent material for the etching mask 4, $SiN_x$, $SiO_2$ or the like is usually used. The etching mask 4 is formed, for example, by a plasma CVD method.

Then, in the first etching procedure, as shown in FIG. 1(b), the upper layer 3 is selectively etched. Any etchant capable of etching the upper layer 3 comprising MAs, but not substantially etching the core layer 2 comprising MP is used as an etchant. As such an etchant, there can be mentioned, for example, a wet etchant comprising a mixture of an organic acid, hydrogen peroxide and water.

As the organic acid, there can be mentioned, for example, carboxylic acid, sulfonic acid and sulfinic acid. Among them, carboxylic acid is used preferably. As the carboxylic acid, there can be mentioned monobasic acid such as formic acid, acetic acid and propionic acid, and polybasic acid such as tartaric acid, maleic acid, malic acid and citric acid. The polybasic acid, in particular, tartaric acid is used suitably. Further, the organic acid may be a metal salt with sodium, potassium, magnesium or the like, or an ammonium salt.

The mixing ratio of the organic acid and hydrogen peroxide, and the concentration thereof in the wet etchant have no particular restriction, and can be selected properly depending, for example, on the thickness of the upper layer 3, and the specific composition of each of the layers. For enhancing the effect of preventing side etching, the hydrogen peroxide/organic acid mixing ratio is preferably selected from a range of 1/10 to 1/50 (by volume). Then, each concentration of the organic acid and hydrogen peroxide in the wet etchant is usually 30 to 50% by weight. Etching is usually conducted at an ordinary temperature.

Then, in the second etching procedure, as shown in FIG. 1(b) to FIG. 1(c), only other faces than the (111) face of the MP crystal in the core layer 2 is predominantly etched selectively, because of the structure of sandwiching the InGaP layer between GaAs layers. The non-etched crystal facet of the core layer 2 is substantially the (111) face, but the facet which appears at a high probability after the crystal face (111) may be present depending on the case. The facet includes the (111) face, and other crystal faces, e. g., (211) face and (311) face.

Because of the structure of sandwiching the core layer 2 composed of MP between the upper layer 3 composed of MAs and the lower layer 1 composed of MAs, when forming the groove 5 by the etchant which selectively etches MP, the etching is performed so that the (111) faces as the facet is mainly exposed.

As the selective etchant, that is, an etchant selectively etching MP relative to MAs, there can be mentioned, for example, hydrochloric acid and a wet etchant comprising a mixture of hydrochloric acid, phosphoric acid and water. Hydrochloric acid is used usually at a concentration from 10 to 36% by weight. In the wet etchant comprising a mixture of hydrochloric acid, phosphoric acid and water, the hydrochloric acid/phosphoric acid mixing ratio is selected usually from a range of 1/10 to 10/1 (by volume) and each concentration of hydrochloric acid and phosphoric acid in the wet etchant is usually 10 to 80% by weight. Etching is usually conducted at a temperature of 25° C. to 100° C.

In the second etching procedure, since the upper layer 3 comprising MAs is formed on the surface of the core layer 2 comprising MP, side etching is restricted. That is, etching is conducted to the core layer 2 without giving changes to ends 31, 31 of the etched upper layer 3, in other words, with no intrusion of each side wall surface forming the groove 5 to the lower surface of the upper layer 3. As a result, the groove 5 has a shape extending from the end at the lower surface of the upper layer 3.

Therefore, the method of forming the groove according to the present invention, less fluctuates the shape of the groove 5 compared with the prior art method that results in large side etching in which each wall surface of the groove intrudes to the lower surface of the upper layer. Therefore, the method of forming the groove according to the present invention can determine the shape of the groove 5 easily, and at a good reproducibility by the epitaxial growth and the photolithography that can be conducted at a high accuracy. In other words, the shape of the groove 5 formed by the present invention is substantially determined by the thickness of the core layer 2 and the width of the etching window formed to the etching mask 4.

In a case where there is no side etching for each wall surface of the groove and only the (111) face of MP crystals such as InGaP is exposed on the formed surface of the core layer 2 by wet etching, an internal angle ($\alpha$) formed between the side wall surface of the groove 5 and the lower layer 1 is theoretically 54.7 degree. However, it seems to be in a case where a crystal faces having probability of appearance next to that of the (111) face of the MP crystals, for example, (311) face (in case of exposure of only the (311) face, an internal angle is 25.2 degree) is partially exposed, the internal angle is smaller than 54.7 degree. Accordingly, the internal angle ($\alpha$), is, as a measured value based on scanning electron microscope (SEM), usually a range from 45 to 60 degree under the consideration of, for example, the kind of crystal faces appearing at a high probability after the (111) face and the measuring error in SEM.

Since accurate control is possible for the thickness of the core layer 2 by the epitaxial growth and for the width of the etching window by the photolithography and wet etching procedure, a groove of any definite shape can be formed easily and at a-good reproducibility by changing them. Further, since no strict control for condition is required in the wet etching procedure and as a result, it may suffice to control only the procedures of the epitaxial growth and the photolithography and wet etching, process control is easy.

The present invention may include, if required, a third etching procedure for selective wet etching the upper layer 3 and/or the lower layer 1 after the second etching procedure. Elimination of the upper layer 3 and/or the lower layer 1 is properly determined depending on the aimed structure of the semiconductor laser diode. In the third etching procedure, the etchant, for example, used for the first etching procedure, may be used.

Figure 2:
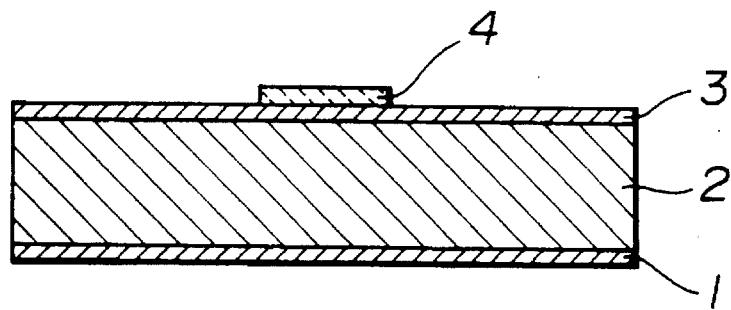
FIG. 2(a), FIG. 2(b) and FIG. 2(c) are explanatory views showing respective steps in case where the method of forming the groove according to the present invention is applied to the formation of a ridge.
Figure 2:
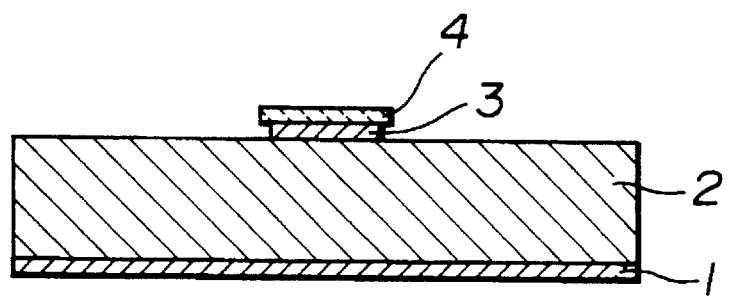
Figure 2:
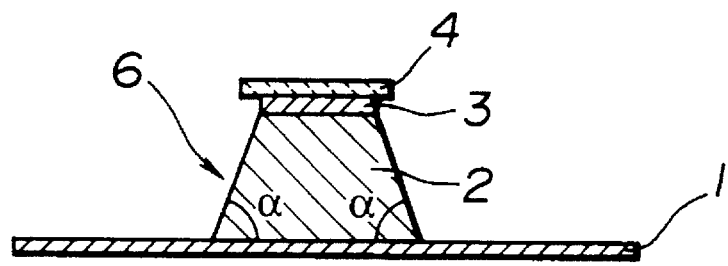

FIG. 2(a) to FIG. 2(c) are explanatory views showing respective steps in which the method of forming the groove according to the present invention is applied to the formation of a ridge. A ridge 6 is formed through each of the foregoing steps shown in FIG. 1(1) to FIG. 1(c) except for forming an etching mask 4, for example, in a stripe-like shape. In FIG. 1(a) to FIG. 1(c), identical reference numerals with those in FIG. 1(a) to FIG. 1(c) have the same meanings.

In the semiconductor laser diode according to the present invention, a so-called III-V group compound single crystal substrate (wafer) is usually used as a first conduction-type substrate. In the present invention, a wafer selected from the group consisting of GaP, GaAs and InP is usually used. Among them, GaAs is used preferably.

Figure 3:
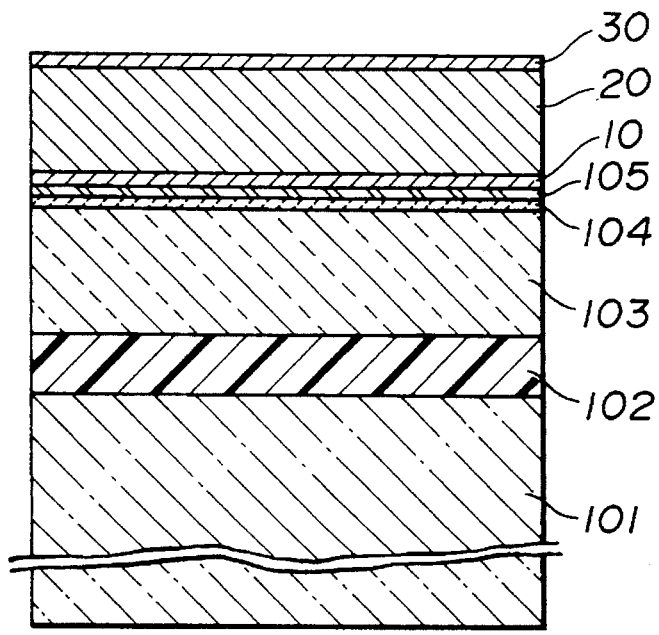
FIG. 3 is a schematic explanatory view illustrating an example of a 1st epitaxial growth phase of a semiconductor laser diode according to the present invention.

Explanation will at first be made with FIG. 3, which represents an epitaxial structure after the 1st epitaxial growth procedure of a semiconductor laser diode according to the present invention.

After the 1st epitaxial growth procedure of a semiconductor laser diode has a structure comprising, on a first conduction-type substrate, at least a first conduction-type lower clad layer, an active layer, a second conduction-type first upper clad layer, an etching stop layer (corresponding to the lower layer 1 in FIG. 1(a) to FIG. 1(c)), a first conduction-type or undoped-type current blocking layer (corresponding to the core layer 2 in FIG. 1(a) to FIG. 1(c)), a cap layer (corresponding to the upper layer 3 in FIG. 1(a) to FIG. 1(c)).

As shown in FIG. 3, substrate 101, buffer layer 102, lower clad layer 103, active layer 104, first upper clad layer 105, etching stop layer 10, current blocking layer 20 and cap layer 30. Each of the layers is formed as an epitaxial layer. Such an epitaxial structure is utilized also in semiconductor laser diodes (a)–(d) of the present invention.

The buffer layer 102 is used in a preferred embodiment, for moderating incompleteness of substrate bulk crystals and facilitating the formation of epitaxial layers with crystal axes being aligned. The buffer layer 102 is preferably made of the identical compound with that of the substrate 101, so that GaAs is usually used for the buffer layer 102 if GaAs is used as the substrate 101.

The lower clad layer 103 and the first upper clad layer 105 are made a material having a refractive index smaller than that of the active layer 104. If GaAs is used for the buffer layer 102, an AlGaAs system ($Al_xGa_{1-x}As$) is usually used for constituting a double hetero structure, in which the Al concentration is properly selected such that the refractive index can satisfy the condition described above. Usually, the Al concentration thereof is defined within a range from 0.15 to 0.80, preferably 0.3 to 0.5. The concentration thereof for the lower clad layer 103 is preferably made identical with that for the first upper clad layer 105, but it is not always necessary.

The active layer 104 is made of a material, for example, of GaAs system, AlGaAs system, InGaAs system and InGaAsP system. As the structure of the layer, there can be adopted, for example, various kinds of quantum well structures (SQW, MQW) comprising thin layers of the materials described above. Then, an optical guide layer is usually used in combination with the active layer 104. For the structure of the optical guide layer, there can be adopted, for example, a structure in which an optical guide layer is disposed on both sides of the active layer (SCH structure) and a structure in which the refractive index is changed continuously by gradually varying the composition of the optical guide layer (GRIN-SCH structure). The material and the structure for the active layer 104 may be selected properly depending on the aimed center wavelength or light output.

The etching stop layer 10 and the cap layer 30 are made of MAs (wherein M represents one or more of elements belonging to the group IIIb of the periodic table). As the specific constituent material, there can be mentioned AlAs, GaAs, InAs, InGaAs and AlGaAs. Among them, GaAs is used preferably.

The current blocking layer 20 comprises MP (wherein M represents one or more of elements belonging to the group IIIb of the periodic table). As the specific constituent material, there can be mentioned, for example, GaP, InP, InGaP, AlGaP and AlGaInP. Among them, InGaP is used preferably. Specifically, $In_{0.5}Ga_{0.5}P$ is preferably used when a GaAs substrate is used.

In each of the conduction-types described above, n-type is usually selected for the first conduction-type and p-type is usually selected for the second conduction-type. As the dopant, Si, Se, Te or the like is usually used for n-type, and Be, Zn, C, Mg or the like is usually used for the p-type. The carrier concentration in each of the layers is properly selected in accordance with the function of each of the layers.

Further, the thickness is selected within a range from 0.1 to 1 μm for the buffer layer 102; from 0.5 to 3 μm for the lower clad layer 103; in a case of the quantum well structure from 0.005 to 0.02 μm per one layer (quantum well or separation layer) for the active layer 104; from 0.05 to 0.3 μm for the first upper clad layer 105; from 0.005 to 0.1 μm for the etching stop layer 10; and from 0.2 to 3 μm for the current blocking layer 20.

Figure 4:
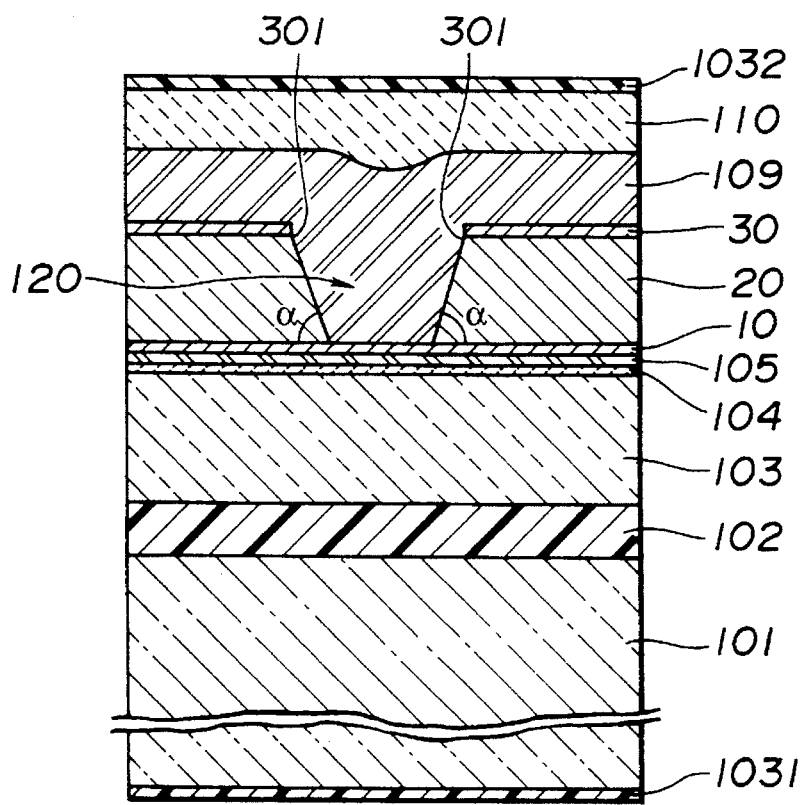
FIG. 4 is an explanatory view of one embodiment of a semiconductor laser diode in the second aspect of the present invention.

FIG. 4 is an explanatory view for one embodiment of the semiconductor laser diode (a) according to the present invention, and after fabricating the 1st epitaxial growth structure shown in FIG. 3 and forming the groove 120, the 2nd epitaxial growth is performed to achieve the semiconductor laser diode. FIG. 4 is a schematic vertical cross sectional view in perpendicular to the cavity direction. The semiconductor laser diode (a) according to the present invention has a groove 120 formed by etching to eliminate a portion for each of the cap layer 30 and the current blocking layer 20 grown over the active layer 104. The groove 120 is an element constituting a current injection path and an optical wave-guide and it usually has a stripe-like shape extending in the cavity direction in a plan view.

The semiconductor laser diode (a) according to the present invention has a feature in which (111) face is predominantly exposed to each of wall surfaces of the groove formed to the current blocking layer 20. Basically, such a characteristic structure can be attained easily by utilizing a substrate with (100) surface upon epitaxial growth of the current blocking layer 20 comprising MP (wherein M represents one or more of elements belonging to the group IIIb of the periodic table).

In the epitaxial growth, since a step is provided to the crystal face in accordance with the known method of using an off angle substrate as mentioned before. In this case, the tilted angle of substrate is usually selected properly within a range from 0.5 to 15 degree. An epitaxial wafer can be produced by using any of known methods, and vapor phase epitaxy methods, particularly, molecular beam epitaxy (MBE) method or metal-organic chemical vapor deposition (MOCVD) method is preferably adopted.

In the etching of the current blocking layer for forming the groove 120, first, known photolithographic technique forming an etching window utilizing an etching mask such as made of $SiN_x$ is adopted. After chapping off MAs and removing $SiN_x$, a known MP selective etching method relative to MAs is adopted. Because of the structure of sandwiching the MP layer between the MAs layers, by using etchant which selectively etches MP, the greater part of the side wall of the obtained groove is composed of the (111) face of MP. The non-etched facet of the current blocking layer 20 is substantially (111) face, but the non-etched facet may include (111) face, and in addition, crystal faces appearing at a high probability after the (111) face, e.g., (211) face and (311) face.

Accordingly, in a case in which a plurality of non-etched facets are present therein, the existent percentage of the (111) face based on non-etched facets from the viewpoint of an internal angle α is usually not less than about 50%. In other words, plurality of non-etched facets include the (111) face, and in addition, one or both of (211) face and (311) face, and the existent percentage of the (111) face based on non-etched facet from the viewpoint of an internal angle α is usually not less than about 50%.

By the selective etching described above, a stripe-like groove 120 extending in the cavity direction is formed by etching to eliminate a portion for each of the cap layer 30 and the current blocking layer 20 grown over the active layer 104. Then, when the cap layer 30 and etching stop layer 10 comprising MAs is formed on the surface of the current blocking layer 20 comprising MP, the side etching is restricted.

Namely, etching for the current blocking layer 20 is conducted without giving change to the ends 301 and 301 of the etched cap layer, in other words, without intrusion of each side wall surface forming the groove 120 to the lower surface of the cap layer 30. As a result, the groove 120 has a shape extending from the end at the lower surface of the cap layer 30.

Therefore, the semiconductor laser diode (a) according to the present invention less fluctuates the shape of the groove 120 compared with the structure of the prior art laser diode that results in large side etching in which each side wall surface of the groove intrudes into the lower surface of the cap layer. Therefore, in the semiconductor laser diode (a) according to the present invention, the shape of the groove 120 can be determined easily and at a good reproducibility by the epitaxial growth and the lithographic technique which can be conducted each at a high accuracy.

If there is no side etching to each side wall surface of the groove and only the (111) face of the MP crystals such as InGaP is exposed, the internal angle ($\alpha$) formed between each side wall surface of the groove 120 and the etching stop layer 10 is theoretically 54.7 degree. However, other faces which appear at a high probability after the crystal face (111), for example, (311) face (in case of the exposure of only the (311) face, an internal angle is 25.2 degree) are partially exposed, the internal angle is smaller than 54.7 degree. Accordingly, the internal angle ($\alpha$), as the measured value based on the SEM, is usually within a range from 45 to 60 degree under the consideration of the kind of the crystal faces appearing at a high probability next to the (111) face of the MP crystals, the extent of the degree of the lattice matching upon epitaxial growth and the measuring error in the SEM.

The semiconductor laser diode (a) according to the present invention is constituted by forming a second conduction-type second upper clad layer 109 and a second conduction-type contact layer 110 successively on the cap layer 30 and the groove 120. Then, the groove 120 is buried with the second upper clad layer 109.

The second clad layer 109 is made of a material having a refractive index smaller than that of the active layer 104 as well as the lower clad layer 103. Specifically, an AlGaAs system ($Al_xGa_{1-x}As$) is usually used and the Al concentration thereof is properly selected such that the refractive index can satisfy the condition described above. Usually, the concentration thereof is defined as within a range from 0.15 to 0.80. The Al concentration of the second clad layer 109 is usually made identical with that of the lower clad layer 103, but this is not always necessary. On the other hand, the contact layer 110 is usually made of GaAs. The thickness for each of the second clad layer 109 and contact layer 110 is usually selected from 0.5 to 8 μm.

An electrode 1031 is formed on the surface of the first conduction-type substrate 101 and if this is an n-type electrode, it is formed by evaporation, for example, AuGe/Ni/Au successively on the surface of the substrate 101 and then alloyed. An electrode 1032 is formed on the surface of the second conduction-type contact layer 110 and, if this is a p-type electrode, it is formed by evaporation, for example, Ti/Pt/Au successively on the surface of the contact layer 110 and then alloyed.

Figure 5:
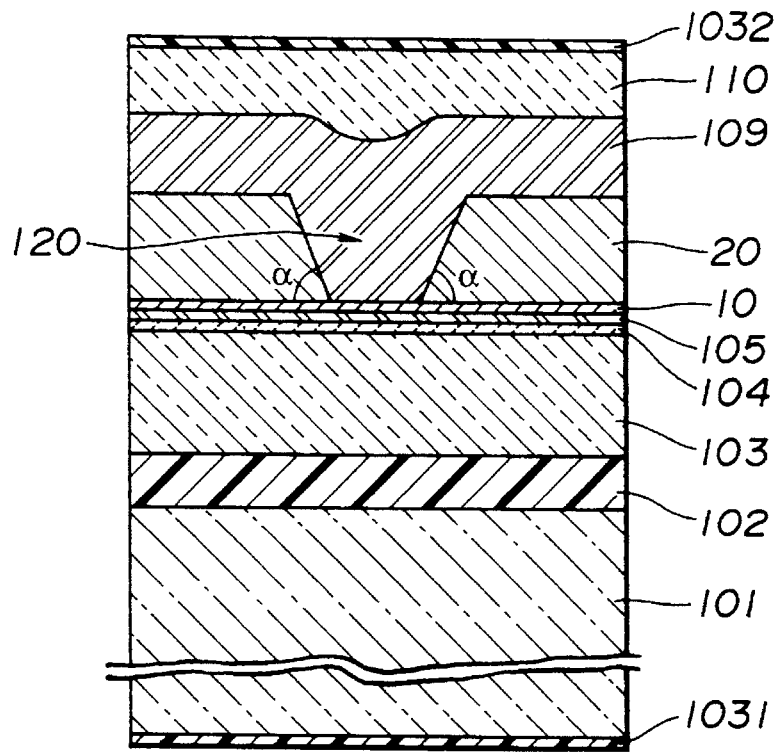
FIG. 5 is an explanatory view of one embodiment of a semiconductor laser diode in the third aspect of the present invention.

FIG. 5 is an explanatory view for one embodiment of a semiconductor laser diode (b) of the present invention, and after fabricating the 1st epitaxial growth structure shown in FIG. 3 and forming the groove, the 2nd epitaxial growth is performed to produce the semiconductor laser diode as well as the fabrication of the semiconductor laser diode (a). FIG. 5 is a schematic vertical cross sectional explanatory view in perpendicular to the cavity direction. The semiconductor laser diode (b) according to the present invention has such a structure that the cap layer 30 in the semiconductor laser diode (a) described previously is eliminated by etching. That is, this laser diode is constituted by forming a groove 120 in accordance with the method described previously, then selectively etching to eliminate the cap layer 30 and forming a second upper clad layer 109 and a contact layer 110 successively.

Figure 6:
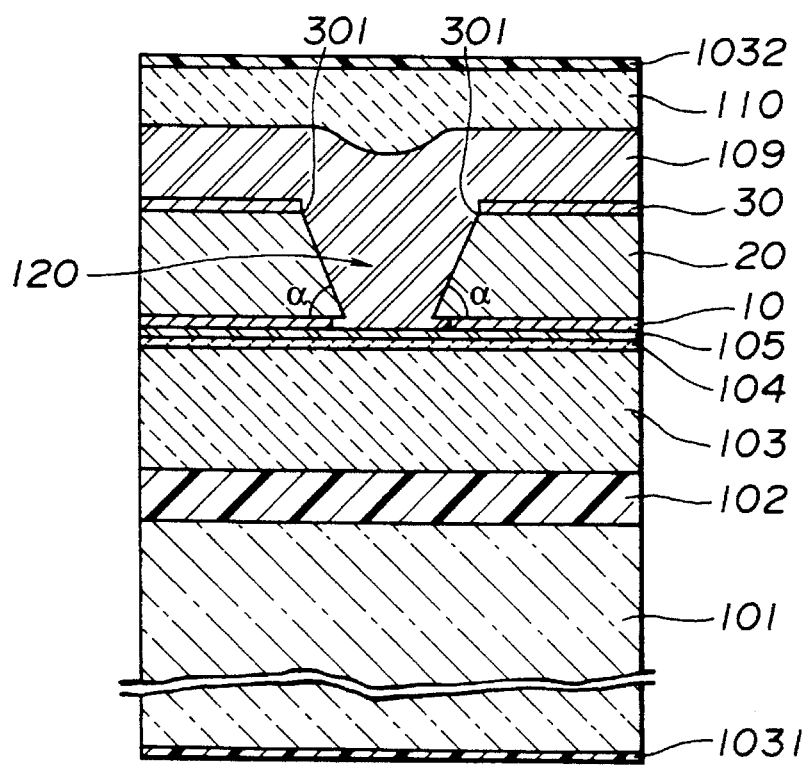
FIG. 6 is an explanatory view of one embodiment of a semiconductor laser diode in the fourth aspect of the present invention.

FIG. 6 is an explanatory view for one embodiment of a semiconductor laser diode (c) of the present invention, and after fabricating the 1st epitaxial growth structure shown in FIG. 3 and forming the groove, the 2nd epitaxial growth is performed to produce the semiconductor laser diode as well as the fabrication of the semiconductor laser diode (a). FIG. 6 is a schematic vertical cross sectional explanatory view in perpendicular to the cavity direction. The semiconductor laser diode (c) according to the present invention has such a structure that the etching stop layer at the bottom of the groove 120 formed to the current blocking layer 20 is eliminated by etching in the semiconductor laser diode (a) described previously. Namely, it is constituted by forming a groove 120 in accordance with the method described previously, then eliminating the etching stop layer at the bottom of the groove 120 by selective etching and forming a second upper clad layer 109 and a contact layer 110 successively.

Figure 7:
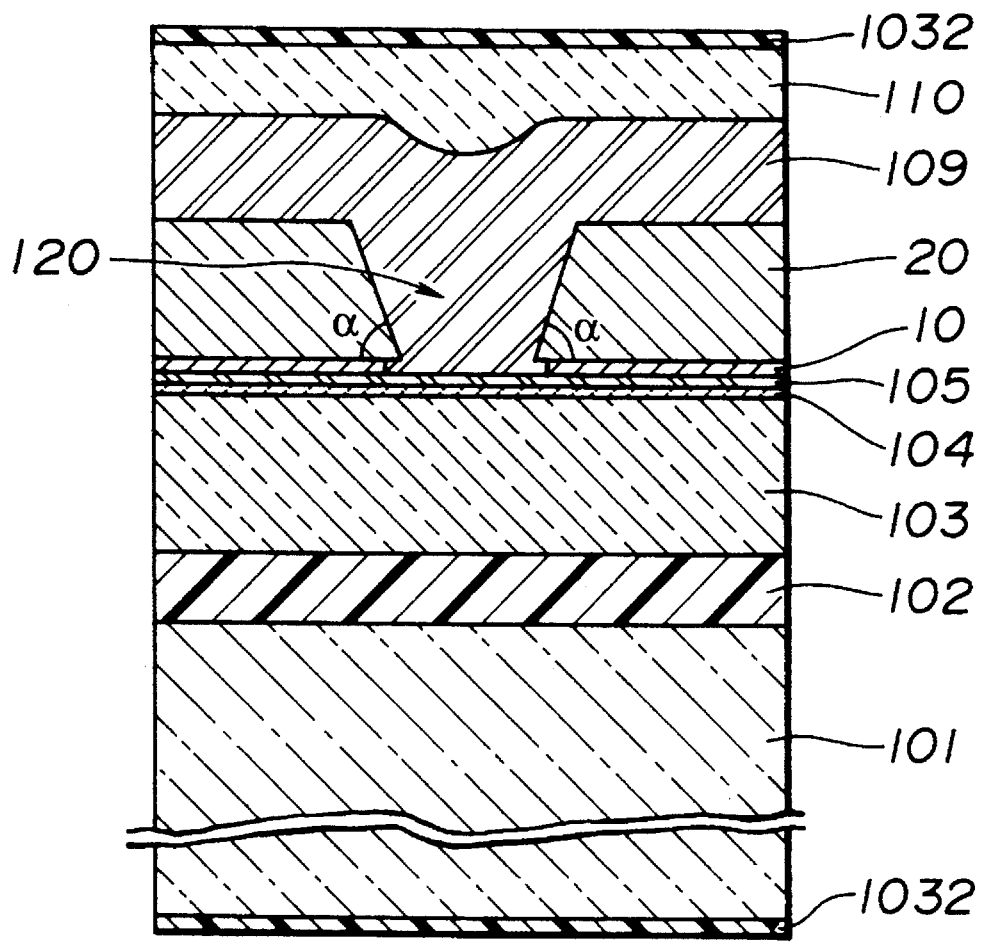
FIG. 7 is an explanatory view of one embodiment of a semiconductor laser diode in the fifth aspect of the present invention.

FIG. 7 is an explanatory view for one embodiment of a semiconductor laser diode (d) of the present invention, and after fabricating the 1st epitaxial growth structure shown in FIG. 3 and forming the groove, the 2nd epitaxial growth is performed to produce the semiconductor laser diode as well as the fabrication of the semiconductor laser diode (a). FIG. 7 is a schematic vertical cross sectional explanatory view in perpendicular to the cavity direction. The semiconductor laser diode (d) according to the present invention is constituted by eliminating the portion of etching stop layer where corresponds to the bottom of the groove 120 and the cap layer in the semiconductor laser diode described previously by selective etching and forming a second upper clad layer 109 and a contact layer 110 successively.

The semiconductor laser diodes (a)–(d) which are completed by forming the electrodes (1031) and (1032) are divided into discrete chips and utilized as laser diodes (LD). Although the foregoing explanations have been made to the laser diode as an example, the semiconductor laser diode according to the present invention is applicable also, for example, to light emitting diodes (LED).

According to the present invention, by selectively etching the structure of sandwiching the MP layer between the MAs layers, the precision groove can be formed easily at a good reproducibility and controllability by using general etchants. From the foregoing, the structure of the discrete chips obtained from the same wafer does not vary and as a result, it is possible to obtain a semiconductor laser diode having properties expected at the designing thereof.

EXAMPLE

The present invention will be explained more in details by way of examples but the invention is not restricted only to the following examples unless it does not go beyond the scope of the invention.

EXAMPLE 1

At first, an epitaxial wafer was obtained by forming, on the surface of a GaAs substrate, a lower layer comprising GaAs (0.6 μm in thickness), a core layer comprising $In_{0.5}Ga_{0.5}P$ (1.0 μm in thickness) and an upper layer comprising GaAs (0.01 μm in thickness) successively by an MBE method.

Then, an $SiN_x$ film (0.1 μm in thickness) was deposited as an etching mask on the upper layer, and a stripe-like etching window of 5 μm in width was formed to the $SiN_x$ film by photolithography and dry etching. Then, after eliminating the photoresist, the upper layer was etched selectively with a wet etchant of an aqueous tartaric acid solution (50 wt %) and aqueous hydrogen peroxide (30 wt %) at a volume ratio of 20/1. Etching was conducted at a temperature of 25° C. for 2 min.

Then, the core layer was selectively etched with an aqueous etching solution of a mixture of hydrochloric acid (36 wt %) and phosphoric acid (85 wt %) at a volume ratio of 1/3. Etching was conducted at a temperature of 70° C. for 2 min. Further, the internal angle (α) formed between each wall surface and the lower layer measured based on the SEM was 53 degree. It is considered that from this internal angle value, the side wall of the groove is substantially composed of (111) faces.

A groove of a definite shape could be formed easily and at a good reproducibility and large side etching could be prevented.

EXAMPLE 2

An epitaxial wafer was obtained by at first forming, on the surface of an n-type GaAs substrate (dopant: Si, carrier concentration: $1 \times 10^{18}$ $cm^{-3}$), by an MBE method, a buffer layer composed of an n-type GaAs (Si: $1 \times 10^{18}$ $cm^{-3}$ thickness: 0.6 μm), a lower clad layer composed of an n-type $Al_{0.3}Ga_{0.7}As$ (Si: $1 \times 10^{18}$ $cm^{-3}$ thickness: 1.5 μm), a lower optical guide layer composed of undoped GaAs (thickness: 3.05 μm), undoped type $In_{0.2}Ga_{0.5}As$ (thickness: 0.006 μm, SQW), an upper optical guide layer composed of undoped GaAs (thickness: 0.05 μm), a first upper clad layer composed of a p-type $Al_{0.3}Ga_{0.7}As$ (Be: $1 \times 10^{18}$ $cm^{-3}$ thickness: 0.1 μm), an etching stop layer composed of a p-type GaAs (Be: $1 \times 10^{18}$ $cm^{-3}$, thickness: 0.01 μm), a current blocking layer composed of an n-type $In_{0.5}Ga_{0.5}P$ (Si: $1 \times 10^{18}$ $cm^{-3}$ thickness: 10 μm), and a cap layer composed of an n-type GaAs (Si: $1 \times 10^{18}$ $cm^{-3}$, thickness: 0.1 μm) successively.

Then, an $SiN_x$ film was formed as an etching mask on the cap layer and a stripe-like aperture of 4 μm in width was formed to the $SiN_x$ film by photolithography. Subsequently, the cap layer was etched selectively with an aqueous etching solution of a mixture of sulfuric acid (98 wt %), aqueous hydrogen peroxide (30 wt %) and water at a volume ratio of 1/1/15 at a temperature of 25° C. and, the $SiN_x$ etching mask was removed by a buffered hydrofluoric acid (mixture of hydrofluoric acid and ammonium fluoride (volume ratio of 1/6)). Further, the current blocking layer was selectively etched at a temperature of 25° C. with an aqueous etching solution comprising a mixture of hydrochloric acid (36 wt %) and water at a volume ratio of 4/1 at a temperature of 25° C. to form a groove.

Further, as a result of measuring the internal angle (α) formed between each wall surface and the etching blocking layer based on the SEM was 53 degree.

After removing the $SiN_x$ film, a second upper clad layer composed of a p-type $Al_{0.3}Ga_{0.7}As$ (Zn: $1 \times 10^{18}$ $cm^{-3}$, thickness: 1.5 μm) was formed on the surface of the cap layer to bury the groove and, further, a contact layer composed of a p-type GaAs (Zn: $5 \times 10^{18}$ $cm^{-3}$, thickness: 3.0 μm) was formed on the surface of the second upper clad layer. The second upper clad layer and the contact layer were grown by an MOCVD method.

Figure 8:
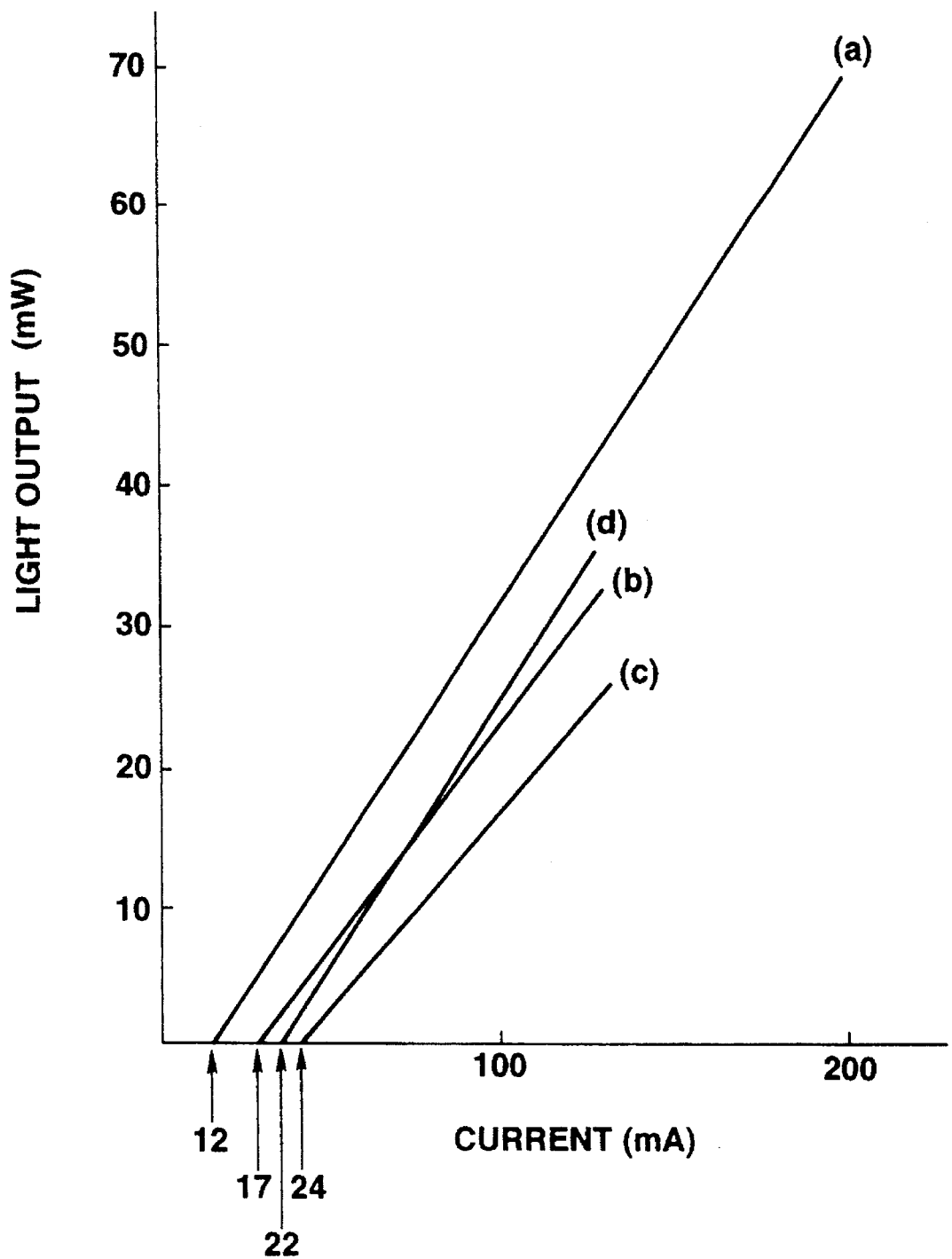
FIG. 8 is a current-output characteristic chart of a laser diode obtained in Examples 2 to 5.

Electrodes were formed on the surface of the substrate and the contact layer and they were divided into discrete chips to obtain laser diodes having cavity length of 500 μm shown in FIG. 4. The p-type electrode was formed by evaporating Ti/Pt/Au successively and then alloyed, while the n-type electrode was formed by evaporating AuGe/Ni/Au successively and then alloyed. The resulting laser diode had center wavelength of 980 nm and a current-light output characteristic measured with no cleaved facet was shown as mark (a) in FIG. 8. The threshold current (Ith) was 12 mA.

EXAMPLE 3

After obtaining an epitaxial wafer in the same procedures as those in Example 2 except for changing the cap layer in Example 2 to a p-type $Al_{0.5}Ga_{0.5}As$ (Be: $1 \times 10^{18}$ $cm^{-3}$, thickness: 0.01 μm), a groove was formed. Each wall surface of the groove was predominantly (111) face of $In_{0.5}Ga_{0.5}P$ crystals, and the internal angle (α) between each wall surface and the etching stop layer was 48 degree.

Then, the cap layer was selectively etched by using an aqueous etching solution of a mixture of an aqueous tartaric acid solution (50 wt %) and aqueous hydrogen peroxide (30 wt %) at a volume ratio of 1/1 at a temperature of 25° C. for 20 sec. Then, a laser diode of a structure shown in FIG. 5 having a cavity length of 500 μm was obtained by the same procedures as those in Example 2. The resultant laser diode had an center wavelength of 980 nm and a current-light output characteristic measured with no cleaved facet as mark (b) in FIG. 8. The threshold current (Ith) was 17 mA.

EXAMPLE 4

After obtaining an epitaxial wafer in the same procedures as those in Example 2 except for changing the cap layer in Example 2 to an etching stop layer P-GaAs (Be: $1 \times 10^{18}$ $cm^{-3}$, thickness: 0.1 μm) and the cap layer in Example 2 to an n-type $Al_{0.5}Ga_{0.5}As$ (Si: $1 \times 10^{18}$ $cm^{-3}$ thickness: 0.1 μm), and a groove was formed. Each wall surface of the groove was predominantly (111) face of $In_{0.5}Ga_{0.5}P$ crystals, and the internal angle (α) between each wall surface and the etching stop layer was 50 degree.

Then, a portion of the etching stop layer (an etching stop layer at the bottom of the groove formed in the current blocking layer) was selectively etched by using an aqueous etching solution of a mixture of an aqueous tartaric acid solution (50 wt %) and aqueous hydrogen peroxide (30 wt %) at volume ratio of 1/1 at a temperature of 25° C. Then, a laser diode of a structure shown in FIG. 6 having a cavity length of 500 μm was obtained by the same procedures as those in Example 2. The resultant laser diode had a center wavelength of 980 nm and a current-light output characteristic measured with no cleaved facet as mark (c) in FIG. 8. The threshold current (Ith) was 24 mA.

EXAMPLE 5

After obtaining an epitaxial wafer in the same procedures as those in Example 2 except for changing the thickness of the cap layer in Example 2 to 0.01 μm, a groove was formed. Each wall surface of the groove was predominantly (111) face of $In_{0.5}Ga_{0.5}P$ crystals and the internal angle (α) formed between each wall surface and the etching stop layer was 54 degree.

Then, a portion of the cap layer and the etching stop layer (an etching stop layer at the bottom of the groove formed in the current blocking layer) was selectively etched by using an aqueous etching solution comprising a mixture of an aqueous tartaric acid solution (50 wt %) and aqueous hydrogen peroxide (30 wt %) at a volume ratio of 20/1 at a temperature of 25° C. In the etching stop layer, a small amount of side etching resulted as shown in FIG. 7. Then, a laser diode of a structure shown in FIG. 7 having a cavity length of 500 μm was obtained by the same procedures as those in Example 2. The resultant laser diode had a center wavelength of 980 nm and a current-light output characteristic measured with no cleaved facet as mark (d) in FIG. 8. The threshold current (Ith) was 22 mA.

What is claimed is:

1. A semiconductor laser diode comprising at least a first conduction-type lower clad layer, an active layer, a second conduction-type first upper clad layer, an etching stop layer, a first conduction-type or undoped type current blocking layer, a cap layer, a second conduction-type second upper clad layer, and a second conduction-type contact layer which are successively grown on a first conduction-type substrate, and having a groove formed by etching to eliminate a portion of the current blocking layer and the cap layer grown over the active layer, each of the etching stop layer and the cap layer comprising MAs, wherein M represents one or more of elements belonging to the group IIIb of the periodic table, the current blocking layer comprising MP, wherein M represents one or more of elements belonging to the group IIIb of the periodic table, and (111) face of MP crystals in the current blocking layer being exposed on wall surface of the groove formed in the current blocking layer, and the etching stop layer at the bottom of the groove formed in the current blocking layer remaining unetched.

2. A semiconductor laser diode according to claim 1, wherein each of the etching stop layer and the cap layer comprises a GaAs material and the current blocking layer comprises an $In_{0.5}Ga_{0.5}P$ material.

3. A semiconductor laser diode comprising at least a first conduction-type lower clad layer, an active layer, a second conduction-type first upper clad layer, an etching stop layer, a first conduction-type or undoped type current blocking layer, a second conduction-type second upper clad layer, and a second conduction-type contact layer which are successively grown on a first conduction-type substrate, and having a groove formed by etching to eliminate a portion of the current blocking layer grown over the active layer, the etching stop layer comprising MAs, wherein M represents one or more of elements belonging to the group IIIb of the periodic table, the current blocking layer comprising MP, wherein M represents one or more of elements belonging to the group IIIb of the periodic table, and (111) face of MP crystals in the current blocking layer being exposed on w-all surface of the groove formed in the current blocking layer, and the etching stop layer at the bottom of the groove formed in the current blocking layer remaining unetched.

4. A semiconductor laser diode according to claim 3, wherein each of the etching stop layer comprises a GaAs material and the current blocking layer comprises an $In_{0.5}Ga_{0.5}P$ material.

5. A semiconductor laser diode comprising at least a first conduction-type lower clad layer, an active layer, a second conduction-type first upper clad layer, an etching stop layer, a first conduction-type or undoped type current blocking layer, a cap layer, a second conduction-type second upper clad layer, and a second conduction-type contact layer which are successively grown on a first conduction-type substrate, and having a groove formed by wet etching to eliminate a portion of the current blocking layer grown over the active layer, each of the etching stop layer and the cap layer comprising MAs, wherein M represents one or more of elements belonging to the group IIIb of the periodic table, the current blocking layer comprising MP, wherein M represents one or more of elements belonging to the group IIIb of the periodic table, (111) face of MP crystals in the current blocking layer being exposed on wall surface of the groove formed in the current blocking layer, the etching stop layer at the bottom of the groove formed in the current blocking layer remaining unetched, and the groove being formed by a photolithography and wet etching procedure of, after fabricating an etching mask on the cap layer, forming an etching window to the etching mask, a first etching procedure of selective wet etching the cap layer, and a second etching procedure of selective wet etching other faces except for the face in which (111) face of MP crystals in the current blocking layer is exposed.

6. A semiconductor laser diode according to claim 5, wherein each of the etching stop layer and the cap layer comprises a GaAs material and the current blocking layer comprises an $In_{0.5}Ga_{0.5}P$ material.

7. A semiconductor laser diode comprising at least a first conduction-type lower clad layer, an active layer, a second conduction-type first upper clad layer, an etching stop layer, a first conduction-type or undoped type current blocking layer, a second conduction-type second upper clad layer, and a second conduction-type contact layer which are successively grown on a first conduction-type substrate, and having a groove formed by wet etching to eliminate a portion of the current blocking layer grown over the active layer, the etching stop layer comprising MAs, wherein M represents one or more of elements belonging to the group IIIb of the periodic table, the current blocking layer comprising MP, wherein M represents one or more of elements belonging to the group IIIb of the periodic table, (111) face of MP crystals in the current blocking layer being exposed on wall surface of the groove formed in the current blocking layer, the etching stop layer at the bottom of the groove formed in the current blocking layer remaining unetched, and the groove being formed by a photolithography and wet etching procedure of, after fabricating an etching mask on the cap layer, forming an etching window to the etching mask, a first etching procedure of selective wet etching the cap layer, a second etching procedure of selective wet etching other faces except for the face in which (111) face of MP crystals in the current blocking layer is exposed, and a third etching procedure of selective wet etching the cap layer.

8. A semiconductor laser diode according to claim 7, wherein each of the etching stop layer comprises a GaAs material and the current blocking layer comprises an $In_{0.5}Ga_{0.5}P$ material.

9. A semiconductor laser diode according to claim 1 or 3, wherein the second conduction-type second upper clad layer comprises AlGaAs.

10. A semiconductor laser diode according to claim 5, or 7, wherein the second conduction-type second upper clad layer comprises AlGaAs.

* * * * *